(12) United States Patent
Wang et al.

(10) Patent No.: US 11,393,378 B2
(45) Date of Patent: Jul. 19, 2022

(54) GATE DRIVING CIRCUIT UNIT, GATE DRIVING CIRCUIT AND DISPLAY DEVICE

(71) Applicant: BOE TECHNOLOGY GROUP CO., LTD., Beijing (CN)

(72) Inventors: Zhichong Wang, Beijing (CN); Guangcai Yuan, Beijing (CN); Fuqiang Li, Beijing (CN); Liwei Liu, Beijing (CN); Jing Feng, Beijing (CN); Peng Liu, Beijing (CN); Xinglong Luan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/355,954

(22) Filed: Jun. 23, 2021

(65) Prior Publication Data

US 2022/0130310 A1 Apr. 28, 2022

(30) Foreign Application Priority Data

Oct. 27, 2020 (CN) .......................... 202011162412.7

(51) Int. Cl.
*G09G 3/20* (2006.01)
(52) U.S. Cl.
CPC ....... *G09G 3/20* (2013.01); *G09G 2300/0426* (2013.01); *G09G 2310/061* (2013.01); *G09G 2310/08* (2013.01)

(58) Field of Classification Search
CPC ... G09G 2310/0286; G09G 2300/0426; G09G 3/3266; G09G 3/3674; G09G 2310/0289
See application file for complete search history.

(56) References Cited

U.S. PATENT DOCUMENTS

| | | | |
|---|---|---|---|
| 2017/0193885 A1* | 7/2017 | Feng | .................... G11C 19/184 |
| 2017/0213515 A1 | 7/2017 | Chen | |
| 2018/0188578 A1 | 7/2018 | Wang | |
| 2020/0402438 A1 | 12/2020 | Xie | |

FOREIGN PATENT DOCUMENTS

| | | |
|---|---|---|
| CN | 105632565 A | 6/2016 |
| CN | 105938711 A | 9/2016 |
| CN | 107978294 A | 5/2018 |
| CN | 109658858 A | 4/2019 |

\* cited by examiner

*Primary Examiner* — Gerald Johnson
(74) *Attorney, Agent, or Firm* — Muncy, Geissler, Olds & Lowe, P.C.

(57) ABSTRACT

A gate driving circuit unit, a gate driving circuit and a display device are provided. The gate driving circuit unit includes a pull-up node noise-reduction circuit and a pull-up control circuit. The pull-up node noise-reduction circuit is electrically connected to an input end, a pull-down node and a pull-up node, and configured to control the pull-up node to be electrically connected to, or electrically disconnected from, the input end under the control of a potential at the pull-down node. The pull-up control circuit is electrically connected to the pull-up node and the input end, and configured to control the pull-up node to be electrically connected to the input end at an input stage.

20 Claims, 6 Drawing Sheets

GATE DRIVING CIRCUIT UNIT, GATE DRIVING CIRCUIT AND DISPLAY DEVICE

CROSS-REFERENCE TO RELATED APPLICATION

This application claims a priority of the Chinese patent application No. 202011162412.7 filed in China on Oct. 27, 2020, which is incorporated herein by reference in its entirety.

TECHNICAL FIELD

The present disclosure relates to the field of display technology, in particular to a gate driving circuit unit, a gate driving circuit and a display device.

BACKGROUND

In a gate driving circuit unit in related art, there is a competing connection relationship between a pull-up node and a pull-down node. The pull-up node is charged by an input signal from an input end, and a potential at the pull-down node is pulled down by the pull-up node through a pull-down Thin Film Transistor (TFT). However, a potential at the pull-up node is also pulled down by the pull-down node through a noise-reduction TFT simultaneously. At an input stage, when the potential at the pull-down node is relatively high, it is impossible to charge the pull-up node, so no gate driving signal is outputted.

SUMMARY

A main object of the present disclosure is to provide a gate driving circuit unit, a gate driving circuit and a display device, so as to solve the above-mentioned problem.

In one aspect, the present disclosure provides in some embodiments a gate driving circuit unit including a pull-up node noise-reduction circuit and a pull-up control circuit. The pull-up node noise-reduction circuit is electrically connected to an input end, a pull-down node and a pull-up node, and configured to control the pull-up node to be electrically connected to, or electrically disconnected from, the input end under the control of a potential at the pull-down node. The pull-up control circuit is electrically connected to the pull-up node and the input end, and configured to control the pull-up node to be electrically connected to the input end at an input stage of the gate driving circuit unit.

In another aspect, the present disclosure provides in some embodiments a gate driving circuit including a plurality of levels of the above-mentioned gate driving circuit units.

In yet another aspect, the present disclosure provides in some embodiments a display device including the above-mentioned gate driving circuit.

DETAILED DESCRIPTION

In order to make the objects, the technical solutions and the advantages of the present disclosure more apparent, the present disclosure will be described hereinafter in a clear manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
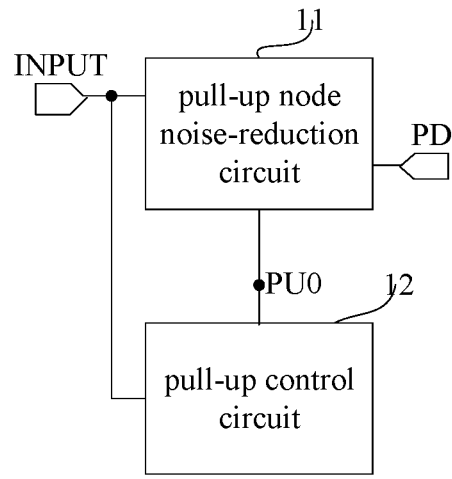
FIG. 1 is a structural view of a gate driving circuit unit according to an embodiment of the present disclosure.

As shown in FIG. 1, the present disclosure provides in some embodiments a gate driving circuit unit, which includes a pull-up node noise-reduction circuit 11 and a pull-up control circuit 12. The pull-up node noise-reduction circuit 11 is electrically connected to an input end INPUT, a pull-down node PD and a pull-up node PU0, and configured to control the pull-up node PU0 to be electrically connected to, or electrically disconnected from, the input end INPUT under the control of a potential at the pull-down node PD. The pull-up control circuit 12 is electrically connected to the pull-up node PU0 and the input end INPUT, and configured to control the pull-up node PU0 to be electrically connected to the input end INPUT at an input stage of the gate driving circuit unit.

During the operation of the gate driving circuit unit in the embodiments of the present disclosure, at an input stage, the pull-up control circuit 12 may control the pull-up node PU0 to be electrically connected to the input end INPUT, so as to charge the pull-up node PU0, thereby to pull up a potential at the pull-up node PU0 at the input stage. In addition, even at the input stage, the potential at the pull-down node PD may be a high voltage. Because the pull-up node noise-reduction circuit 11 controls the pull-up node PU0 to be electrically connected to the input end INPUT under the control of the potential at the pull-down node PD, the potential at the pull-up node PU0 may not be pulled down. In this way, it is able to prevent the pull-up node from being charged insufficiently due to the competition between the pull-up node and the pull-down node, thereby to charge the pull-up node PU0 at the input stage in a better manner.

During the implementation, the gate driving circuit unit in the embodiments of the present disclosure may further includes an energy storage circuit electrically connected to the pull-up node and configured to store electric energy for maintaining the potential at the pull-up node.

In the embodiments of the present disclosure, the gate driving circuit unit may be based on, but not limited to, an oxide technology, an amorphous silicon (a-Si) technology, or a Low Temperature Poly Silicon (LTPS) technology.

In a possible embodiment of the present disclosure, the pull-up node noise-reduction circuit may be electrically connected to one pull-down node. The pull-up node noise-reduction circuit may include a pull-up node noise-reduction transistor, a control electrode of which is electrically connected to the pull-down node, a first electrode of which is electrically connected to the pull-up node, and a second electrode of which is electrically connected to the input end.

Alternatively, the pull-down node may include a first pull-down node and a second pull-down node, and the pull-up node noise-reduction circuit may include a first pull-up node noise-reduction transistor and a second pull-up node noise-reduction transistor. A control electrode of the first pull-up node noise-reduction transistor may be electrically connected to the first pull-down node, a first electrode of the first pull-up node noise-reduction transistor may be electrically connected to the pull-up node, and a second electrode of the first pull-up node noise-reduction transistor may be electrically connected to the input end. A control electrode of the second pull-up node noise-reduction transistor may be electrically connected to the second pull-down node, a first electrode of the second pull-up node noise-reduction transistor may be electrically connected to the pull-up node, and a second electrode of the second pull-up node noise-reduction transistor may be electrically connected to the input end.

During the implementation, the pull-up control circuit is further configured to reset the potential at the pull-up node at a resetting stage of the gate driving circuit unit, so as to pull down the potential at the pull-up node.

In a possible embodiment of the present disclosure, the pull-up control circuit may further include a pull-up control transistor, a control electrode of which is electrically connected to a first clock signal end, a first electrode of which is electrically connected to the pull-up node, and a second electrode of which is electrically connected to the input end.

In a possible embodiment of the present disclosure, the pull-up control circuit may include an input transistor and a resetting transistor. A control electrode and a first electrode of the input transistor may be electrically connected to the input end, and a second electrode of the input transistor may be electrically connected to the pull-up node. A control electrode of the resetting transistor may be electrically connected to a resetting end, a first electrode of the resetting transistor may be electrically connected to the pull-up node, and a second electrode of the resetting transistor may be electrically connected to a first low voltage end or the input end.

Figure 2:
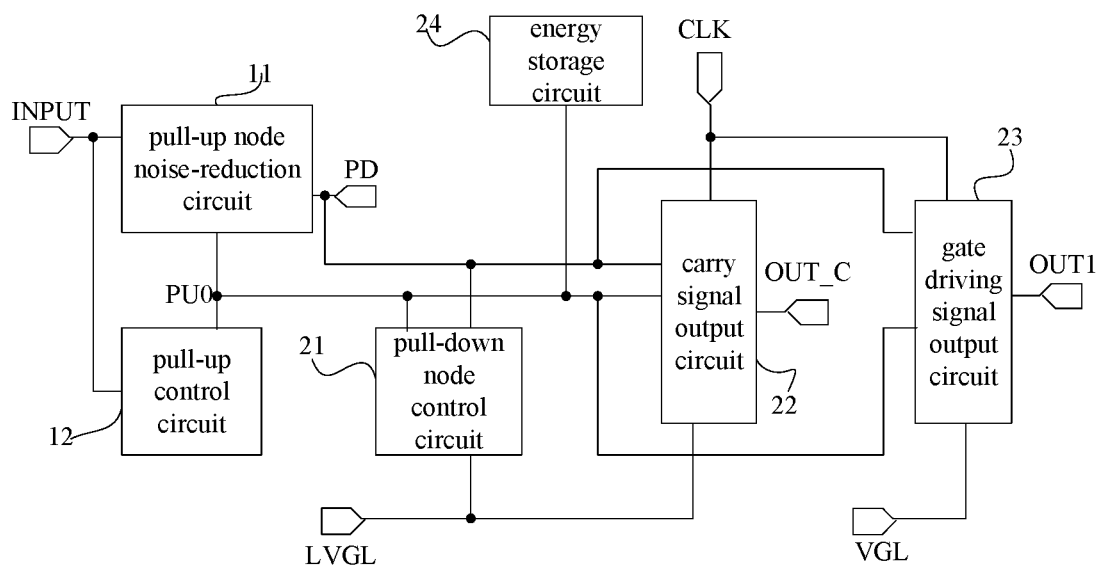
FIG. 2 is another structural view of the gate driving circuit unit according to an embodiment of the present disclosure.

In the embodiments of the present disclosure, as shown in FIG. 2, on the basis of the gate driving circuit unit in FIG. 1, the gate driving circuit unit may further include a pull-down node control circuit 21, a carry signal output circuit 22, a gate driving signal output circuit 23 and an energy storage circuit 24.

The pull-down node control circuit 21 may be electrically connected to the pull-up node PU0, the pull-down node PD and a first low voltage end, and configured to control the pull-down node to be electrically connected to a control voltage end under the control of a control voltage provided by the control voltage end, and control the pull-down node to be electrically connected to, or electrically disconnected from, the first low voltage end under the control of the potential at the pull-up node. The first low voltage end is configured to provide a first low voltage LV GL.

The energy storage circuit 24 may be electrically connected to the pull-up node PU0, and configured to maintain the potential at the pull-up node PU0.

The carry signal output circuit 22 may be electrically connected to a carry signal output end OUT_C, the pull-up node PU0, the pull-down node PD, a second clock signal end and the first low voltage end, and configured to control the carry signal output end OUT_C to be electrically connected to the second clock signal end under the control of the potential at the pull-up node PU0, and control the carry signal output end OUT_C to be electrically connected to the first low voltage end under the control of the potential at the pull-down node PD. The second clock signal end is configured to provide a second clock signal CLK, and the first low voltage end is configured to provide the first low voltage LVGL.

The gate driving signal output circuit 23 may be electrically connected to a gate driving signal output end OUT1, the pull-up node PU0, the pull-down node PD, the second clock signal end and a second low voltage end, and configured to control the gate driving signal output end OUT1 to be electrically connected to the second clock signal end under the control of the potential at the pull-up node PU0, and control the gate driving signal output end OUT1 to be electrically connected to the second low voltage end under the control of the potential at the pull-down node PD. The second low voltage end is configured to provide a second low voltage VGL.

During the implementation, the pull-down node control circuit 21 may control the potential at the pull-down node PD under the control of the control voltage and the potential at the pull-up node PU0. The energy storage circuit 24 may maintain the potential at the pull-up node PU0. The carry signal output circuit 22 may control the carry signal output end OUT_C to output a carry signal under the control of the potential at the pull-up node PU0 and the potential at the pull-down node PD, so as to provide an input signal and a resetting signal to a next-level gate driving circuit unit. The gate driving signal output circuit 23 may control the gate driving signal output end OUT1 to output a gate driving signal under the control of the potential at the pull-up node PU0 and the potential at the pull-down node PD.

In a possible embodiment of the present disclosure, the first low voltage provided by the first low voltage end may be smaller than the second low voltage provided by the second low voltage end, so as to compensate for a stress of a first gate driving output transistor of the gate driving signal output circuit for outputting the gate driving signal at a non-output stage of the gate driving circuit unit, thereby to relieve a drift of a threshold voltage of the first gate driving output transistor.

In a possible embodiment of the present disclosure, the pull-down node may include a first pull-down node and a second pull-down node, and the control voltage end may include a first control voltage end and a second control voltage end. The pull-down node control circuit is configured to control a potential at the first pull-down node under the control of a first control voltage provided by the first control voltage end, control the first pull-down node to be electrically connected to, or electrically disconnected from, the first low voltage end under the control of the pull-up node, control the potential at the second pull-down node under the control of a second control voltage provided by the second control voltage end, and control the second pull-down node to be electrically connected to the first low voltage end under the control of the pull-up node.

During the implementation, when the gate driving circuit unit in the embodiments of the present disclosure includes the first pull-down node and the second pull-down node, the gate driving circuit unit may include the first control voltage end and the second control voltage end. When the first control voltage provided by the first control voltage end is a high voltage, the second control voltage provided by the second control voltage end may be a low voltage, and when the first control voltage is a low voltage, the second control voltage may be a high voltage. In this way, a transistor controlled by the first control voltage end and a transistor controlled by the second control voltage end may operate alternately, so as to prevent the occurrence of a threshold voltage drift when the transistor controlled by the first control voltage end and the transistor controlled by the second control voltage end are in an on state within a long time period.

In the embodiments of the present disclosure, the first control voltage end and the second control voltage end may provide high voltages alternately at a predetermined interval (the predetermined interval may be smaller than or greater than a time for displaying one image frame, and the predetermined interval may be selected according to the practical need). In other words, when the first control voltage end provides a high voltage, the second control voltage end may provide a low voltage, and when the first control voltage end provides a low voltage, the second control voltage end may provide a high voltage.

In a possible embodiment of the present disclosure, the pull-down node control circuit may include a first pull-down control transistor, a second pull-down control transistor, a third pull-down control transistor and a fourth pull-down control transistor. A control electrode and a first electrode of the first pull-down control transistor may be electrically connected to the first control voltage end, and a second electrode of the first pull-down control transistor may be electrically connected to the first pull-down node. A control electrode of the second pull-down control transistor may be electrically connected to the pull-up node, a first electrode of the second pull-down control transistor may be electrically connected to the first pull-down node, and a second electrode of the second pull-down control transistor may be electrically connected to the first low voltage end. A control electrode and a first electrode of the third pull-down control transistor may be electrically connected to the second control voltage end, and a second electrode of the third pull-down control transistor may be electrically connected to the second pull-down node. A control electrode of the fourth pull-down control transistor may be electrically connected to the pull-up node, a first electrode of the fourth pull-down control transistor may be electrically connected to the second pull-down node, and a second electrode of the fourth pull-down control transistor may be electrically connected to the first low voltage end.

In the embodiments of the present disclosure, the pull-down node may include a first pull-down node and a second pull-down node, the carry signal output circuit may include a first carry signal output transistor, a second carry signal output transistor and a third carry signal output transistor, and the gate driving signal output circuit may include a first gate driving output transistor, a second gate driving output transistor and a third gate driving output transistor.

A control electrode of the first carry signal output transistor may be electrically connected to the pull-up node, a first electrode of the first carry signal output transistor may be electrically connected to the second clock signal end, and a second electrode of the first carry signal output transistor may be electrically connected to the carry signal output end.

A control electrode of the second carry signal output transistor may be electrically connected to the first pull-down node, a first electrode of the second carry signal output transistor may be electrically connected to the carry signal output end, and a second electrode of the second carry signal output transistor may be electrically connected to the first low voltage end.

A control electrode of the third carry signal output transistor may be electrically connected to the second pull-down node, a first electrode of the third carry signal output transistor may be electrically connected to the carry signal output end, and a second electrode of the third carry signal output transistor may be electrically connected to the first low voltage end.

A control electrode of the first gate driving output transistor may be electrically connected to the pull-up node, a first electrode of the first gate driving output transistor may be electrically connected to the second clock signal end, and a second electrode of the first gate driving output transistor may be electrically connected to the gate driving signal output end.

A control electrode of the second gate driving output transistor may be electrically connected to the first pull-down node, a first electrode of the second gate driving output transistor may be electrically connected to the gate driving signal output end, and a second electrode of the second gate driving output transistor may be electrically connected to the second low voltage end.

A control electrode of the third gate driving output transistor may be electrically connected to the second pull-down node, a first electrode of the third gate driving output transistor may be electrically connected to the gate driving signal output end, and a second electrode of the third gate driving output transistor may be electrically connected to the second low voltage end.

Figure 3:
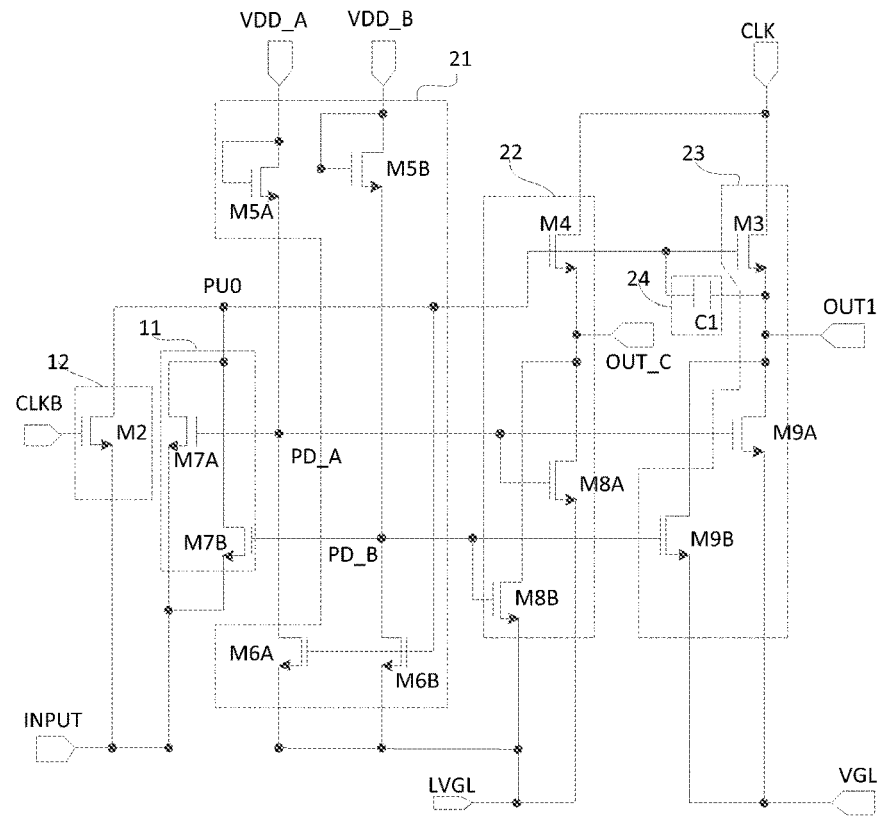
FIG. 3 is a circuit diagram of the gate driving circuit unit according to an embodiment of the present disclosure.

As shown in FIG. 3, in some embodiments of the present disclosure, the gate driving circuit unit includes a pull-up node noise-reduction circuit 11, a pull-up control circuit 12, a pull-down node control circuit 21, a carry signal output circuit 22, a gate driving signal output circuit 23 and an energy storage circuit 24.

The pull-down node includes a first pull-down node PD_A and a second pull-down node PD_B, and a control voltage end includes a first control voltage end VDD_A and a second control voltage end VDD_B.

The pull-up node noise-reduction circuit 11 includes a first pull-up node noise-reduction transistor M7A and a second pull-up node noise-reduction transistor M7B. A gate electrode of the first pull-up node noise-reduction transistor M7A is electrically connected to the first pull-down node PD_A, a drain electrode of the first pull-up node noise-reduction transistor M7A is electrically connected to the pull-up node PU0, and a source electrode of the first pull-up node noise-reduction transistor M7A is electrically connected to the input end INPUT. A gate electrode of the second pull-up node noise-reduction transistor M7B is electrically connected to the second pull-down node PD_B, a drain electrode of the second pull-up node noise-reduction transistor M7B is electrically connected to the pull-up node PU0, and a source electrode of the second pull-up node noise-reduction transistor M7B is electrically connected to the input end INPUT.

The pull-up control circuit 12 includes a pull-up control transistor M2, a gate electrode of which is electrically connected to a first clock signal end, a drain electrode of which is electrically connected to the pull-up node PU0, and a source electrode of which is electrically connected to the input end INPUT. The first clock signal end is configured to provide a first clock signal CLKB.

The pull-down node control circuit 21 includes a first pull-down control transistor M5A, a second pull-down control transistor M6A, a third pull-down control transistor M5B and a fourth pull-down control transistor M6B. A gate electrode and a drain electrode of the first pull-down control transistor M5A are electrically connected to the first control voltage end VDD_A, and a source electrode of the first pull-down control transistor M5A is electrically connected to the first pull-down node PD_A. A gate electrode of the second pull-down control transistor M6A is electrically connected to the pull-up node PU0, a drain electrode of the second pull-down control transistor M6A is electrically connected to the first pull-down node PD_A, and a source electrode of the second pull-down control transistor M6A is electrically connected to the first low voltage end. The first low voltage end is configured to provide a first low voltage LVGL. A gate electrode and a drain electrode of the third pull-down control transistor M5B are electrically connected to the second control voltage end VDD_B, and a source electrode of the third pull-down control transistor M5B is electrically connected to the second pull-down node PD_B. A gate electrode of the fourth pull-down control transistor M6B is electrically connected to the pull-up node PU0, a drain electrode of the fourth pull-down control transistor M6B is electrically connected to the second pull-down node PD_B, and a source electrode of the fourth pull-down control transistor M6B is electrically connected to the first low voltage end.

The carry signal output circuit 22 includes a first carry signal output transistor M4, a second carry signal output transistor M8A and a third carry signal output transistor M8B, and the gate driving signal output circuit 23 includes a first gate driving output transistor M3, a second gate driving output transistor M9A and a third gate driving output transistor M9B.

A gate electrode of the first carry signal output transistor M4 is electrically connected to the pull-up node PU0, a drain electrode of the first carry signal output transistor M4 is electrically connected to the second clock signal end, and a source electrode of the first carry signal output transistor M4 is electrically connected to the carry signal output end OUT_C. The second clock signal end is configured to provide a second clock signal CLK.

A gate electrode of the second carry signal output transistor M8A is electrically connected to the first pull-down node PD_A, a drain electrode of the second carry signal output transistor M8A is electrically connected to the carry signal output end OUT_C, and a source electrode of the second carry signal output transistor M8A is electrically connected to the first low voltage end. The first low voltage end is configured to provide a first low voltage LVGL.

A gate electrode of the third carry signal output transistor M8B is electrically connected to the second pull-down node PD_B, a drain electrode of the third carry signal output transistor M8B is electrically connected to the carry signal output end OUT_C, and a source electrode of the third carry signal output transistor M8B is electrically connected to the first low voltage end.

A gate electrode of the first gate driving output transistor M3 is electrically connected to the pull-up node PU0, a drain electrode of the first gate driving output transistor M3 is electrically connected to the second clock signal end, and a source electrode of the first gate driving output transistor M3 is electrically connected to the gate driving signal output end OUT1.

A gate electrode of the second gate driving output transistor M9A is electrically connected to the first pull-down node PD_A, a drain electrode of the second gate driving output transistor M9A is electrically connected to the gate driving signal output end OUT1, and a source electrode of the second gate driving output transistor M9A is electrically connected to the second low voltage end. The second low voltage end is configured to provide a second low voltage VGL.

A gate electrode of the third gate driving output transistor M9B is electrically connected to the second pull-down node PD_B, a drain electrode of the third gate driving output transistor M9B is electrically connected to the gate driving signal output end OUT1, and a source electrode of the third gate driving output transistor M9B is electrically connected to the second low voltage end.

The energy storage circuit 24 includes a storage capacitor C1, a first end of which is electrically connected to the pull-up node PU0, and a second end of which is electrically connected to the gate driving signal output end OUT1.

In the gate driving circuit unit in FIG. 3, all the transistors may be, but not limited to, N-channel Metal Oxide Semiconductor (NMOS) transistors.

Figure 4:
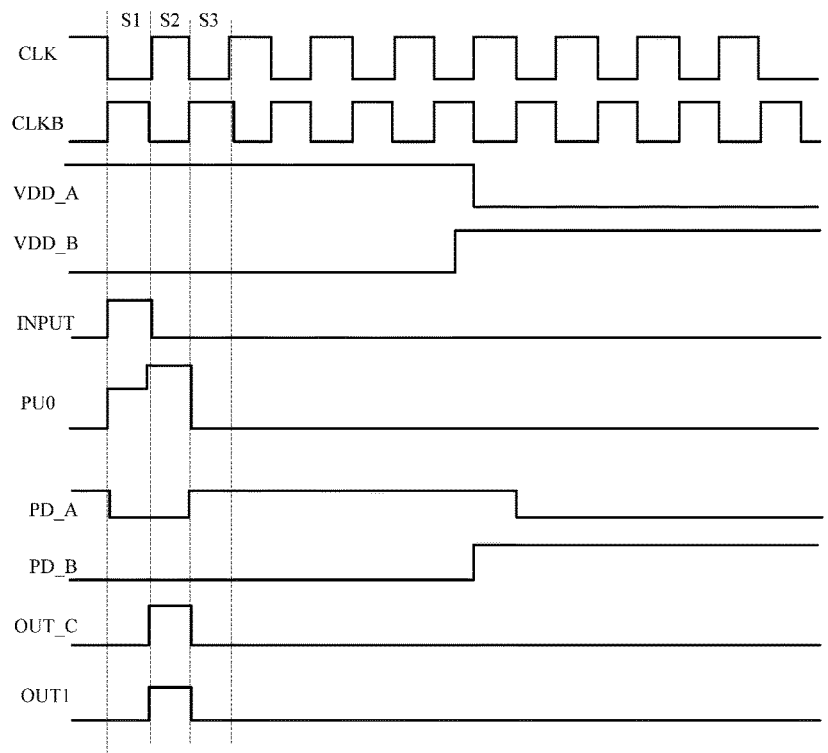
FIG. 4 is a sequence diagram of the gate driving circuit unit in FIG. 3.

As shown in FIG. 4, during the operation of the gate driving circuit unit in FIG. 3, at an input stage S1, CLKB may be a high voltage, CLK may be a low voltage, VDD_A may provide a high voltage, VDD_B may provide a low voltage, and INPUT may provide a high voltage, so as to turn on M2 and enable PU to be electrically connected to INPUT, thereby to charge C1 through INPUT. The potential at PU may be high voltage, so as to turn on M6A and M6B. The potential at PD_A and the potential at PD_B may each be a low voltage. In addition, the source electrode of M7A and the source electrode of M7B are electrically connected to INPUT, even when the potential at PD_A and the potential at PD_B are not pulled down rapidly at the input stage S1, M7A and M7B may be turned on, and PU may be electrically connected to INPUT, so as to charge PU and prevent the occurrence of a competition risk between the PD and the PU at the input stage as compared with the related art.

At an output stage S2, CLKB may be a low voltage, CLK may be a high voltage, VDD_A may provide a high voltage, VDD_B may provide a low voltage, and INPUT may provide a low voltage. The potential at PU may be bootstrapped by C1, so as to fully turn on M3 and M4, and deliver CLK to OUT_C and OUT1. At this time, M6A and M6B are fully turned on, the potential at PD may be a low voltage, and the transistors related to the noise reduction may be turned off.

At a resetting stage S3, CLKB may be a high voltage, CLK may be a low voltage, VDD_A may provide a high voltage, VDD_B may provide a low voltage, and INPUT may provide a low voltage, so as to turn on M2 and pull down the potential at PU to a low voltage. M5A may be turned on, and M5B, M6A and M6B may be turned off, so as to pull up the potential at PD_A to a high voltage. The potential at PD_B may be a low voltage, and M7A may be turned on, so as to enable PU to be electrically connected to INPUT.

After the resetting stage S3 has been ended for a period of time and before a next-frame signal has arrived or after a time for displaying several image frames, VDD_A may be changed to provide a low voltage and VDD_B may be changed to provide a high voltage, so as to maintain a normal noise-reduction function. In addition, it is able to prevent the gate driving circuit unit from failing due to a positively-biased threshold voltage when M7A, M7B, M8A, M8B, M9A and M9B are subjected to a forward stress for a long period of time.

Figure 5:
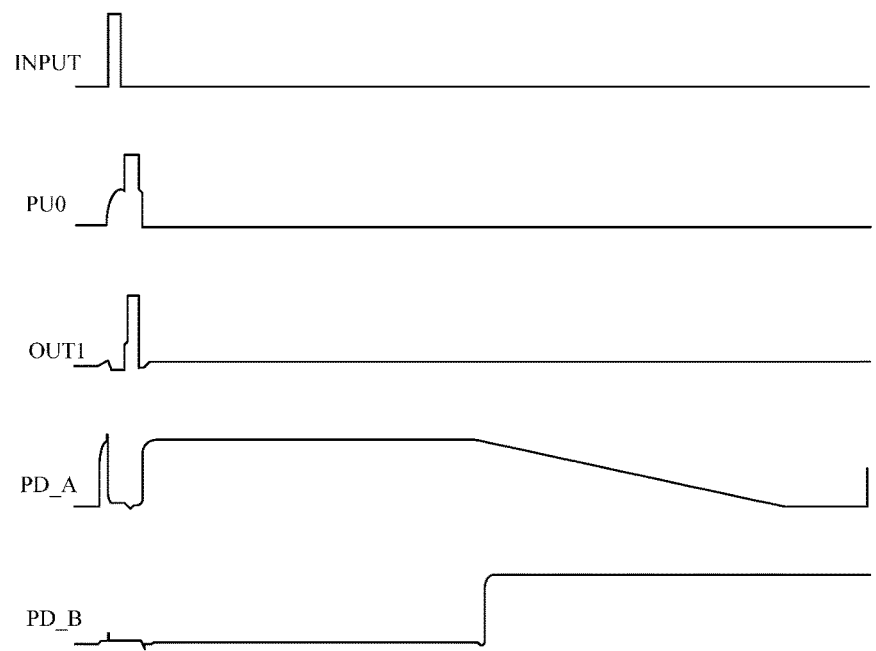
FIG. 5 is a simulation sequence diagram of the gate driving circuit unit in FIG. 3.

FIG. 5 is a simulation sequence diagram of the gate driving circuit unit in FIG. 3.

During the operation of the gate driving circuit unit in FIG. 3, when a duty ratio of a clock signal adopted by the gate driving circuit unit is smaller than 0.5, there may exist a first time period between the input stage and the output stage, and a second time period between the output stage and the resetting stage. Within the first time period and the second time period, OUT1 may output LVGL (the potential of CLK may be LVGL within the first time period and the second time period).

The gate driving circuit unit in FIG. 6 may differ from the gate driving circuit unit in FIG. 3 as follows. The pull-up control circuit 12 includes an input transistor M1 and a resetting transistor M0. A gate electrode and a drain electrode of M1 are electrically connected to the input end INPUT, and a source electrode of M1 is electrically connected to the pull-up node PU0. A gate electrode of M0 is electrically connected to a resetting end RST, a drain electrode of M0 is electrically connected to PU0, and a source electrode of M0 is electrically connected to the input end INPUT.

Figure 6:
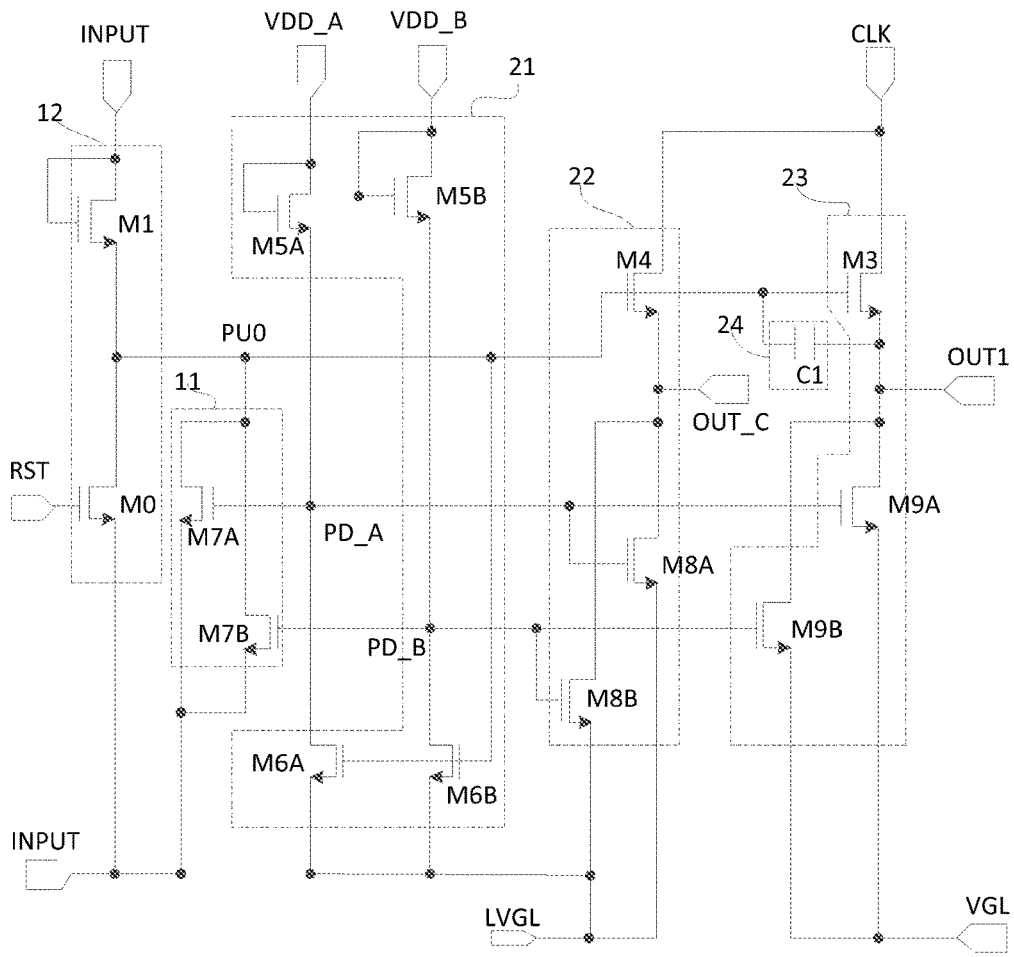
FIG. 6 is another circuit diagram of the gate driving circuit unit according to an embodiment of the present disclosure.

In FIG. 6, the source electrode M0 may also receive the first low voltage LVGL.

In FIG. 6, M1 and M0 may each be, but not limited to, an NMOS transistor.

Figure 7:
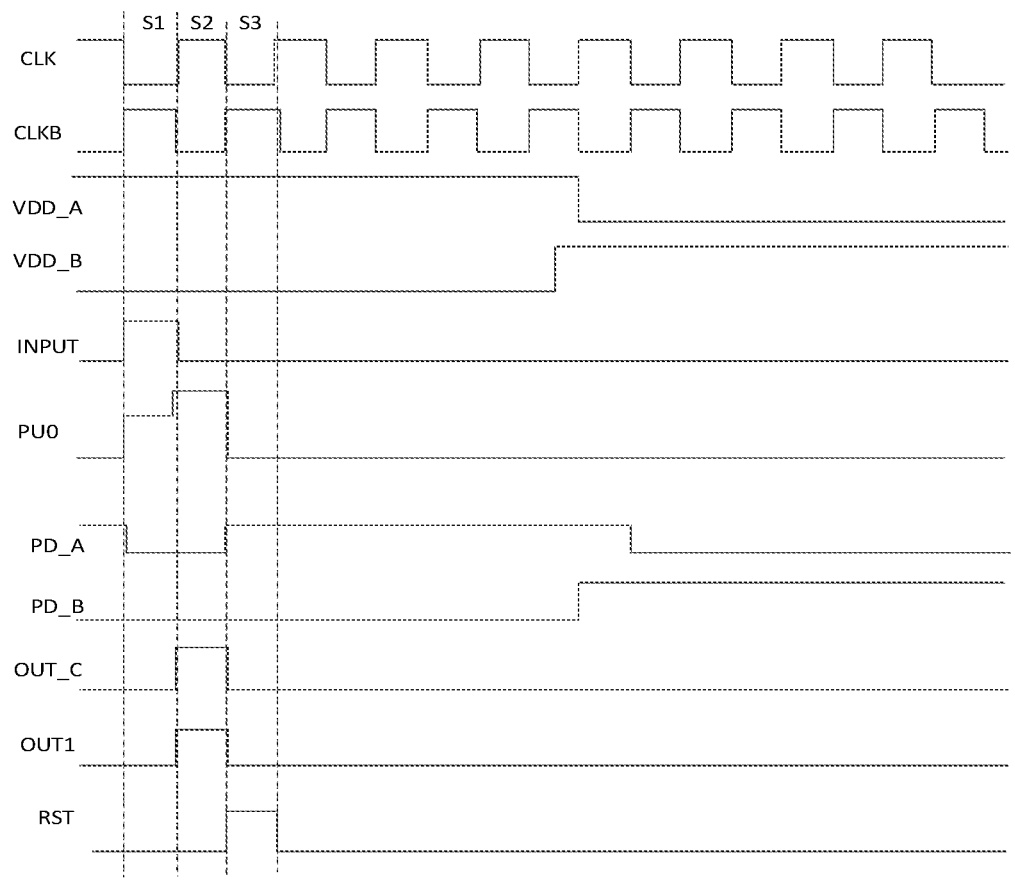
FIG. 7 is a sequence diagram of the gate driving circuit unit in FIG. 6.

As shown in FIG. 7, during the operation of the gate driving circuit unit in FIG. 6, at the input stage S1, INPUT may provide a high voltage, so as to turn on M1 and enable PU to be electrically connected to INPUT. RST may provide a low voltage, so as to turn off M0.

At the output stage S2, INPUT and RST may each provide a low voltage, so as to turn off M1 and M0.

At the resetting stage S3, INPUT may provide a low voltage, and RST may provide a high voltage, so as to turn off M1 and turn on M0, thereby to pull down the potential at PU.

During the implementation, the pull-up node may include a first pull-up node and a second pull-up node, and the gate driving circuit unit may further include a pull-up node control circuit. The pull-up node control circuit may be electrically connected to a control voltage end, the first pull-up node and the second pull-up node, and configured to control the first pull-up node to be electrically connected to, or electrically disconnected from, the second pull-up node under the control of a control voltage provided by the control voltage end, and maintain a potential at the second pull-up node. The pull-up node noise-reduction circuit may be electrically connected to the first pull-up node, and configured to control the first pull-up node to be electrically connected to the input end under the control of the potential at the pull-down node PD. The pull-up control circuit may be electrically connected to the first pull-up node, and configured to control the first pull-up node to be electrically connected to the input end at the input stage.

During the operation of the gate driving circuit unit, at the input stage, the pull-up node control circuit may control the first pull-up node to be electrically connected to the second pull-up node under the control of the control voltage, so as to charge the energy storage circuit until the potential at the second pull-up node has been pulled up to a certain value. Then, the pull-up node control circuit may control the first pull-up node to be electrically disconnected from the second pull-up node, so as to charge the second pull-up node. In addition, during the operation of the gate driving circuit unit, within a time period between the input stage and the output stage (in the embodiments of the present disclosure, when a duty ratio of the clock signal adopted by the gate driving circuit unit is not equal to 0.5, there may exist a time period between the input stage and the output stage), the pull-up node control circuit may prevent the potential at the second pull-up node from being pulled down due to current leakage under the control of the control voltage, thereby to prevent the occurrence of such a situation where the potential at the pull-down node cannot be pulled down.

In a possible embodiment of the present disclosure, the pull-up node control circuit may include a pull-up control transistor, a control electrode of which is electrically connected to the control voltage end, a first electrode of which is electrically connected to the second pull-up node, and a second electrode of which is electrically connected to the first pull-up node.

Figure 8:
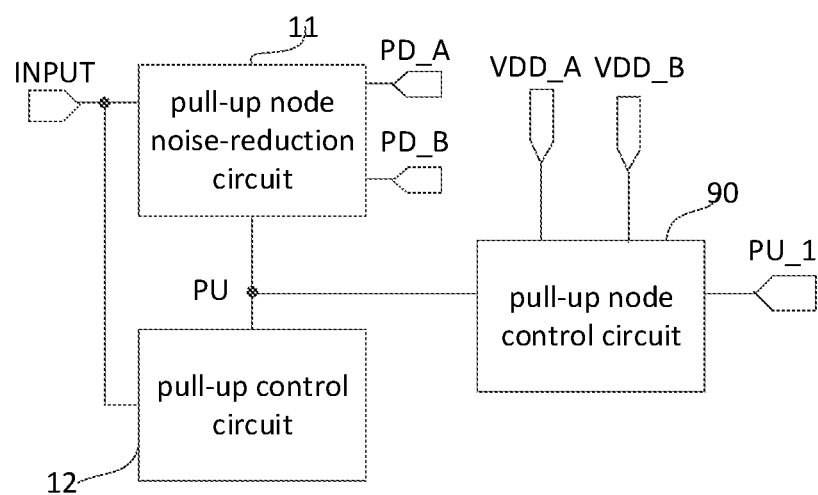
FIG. 8 is yet another structural view of the gate driving circuit unit according to an embodiment of the present disclosure.

As shown in FIG. 8, on the basis of the gate driving circuit unit in FIG. 1, the pull-up node may include a first pull-up node PU and a second pull-up node PU_1, and the control voltage end may include a first control voltage end VDD_A and a second control voltage end VDD_B. The gate driving circuit unit may further include a pull-up node control circuit 90, and the pull-down node may include a first pull-down node PD_A and a second pull-down node PD_B.

The pull-up node control circuit 90 is electrically connected to the first control voltage end VDD_A, the second control voltage end VDD_B, the first pull-up node PU and the second pull-up node PU_1, and configured to control the first pull-up node PU to be electrically connected to, or electrically disconnected from, the second pull-up node PU_1 under the control of a first control voltage provided by the first control voltage end VDD_A, control the first pull-up node PU to be electrically connected to, or electrically disconnected from, the second pull-up node PU_1 under the control of a second control voltage provided by the second control voltage end VDD_B, and maintain a potential at the second pull-up node PU_1.

The pull-up node noise-reduction circuit 11 is electrically connected to the first pull-up node PU, and configured to control the first pull-up node PU to be electrically connected to the input end INPUT under the control of a potential at the pull-down node PD.

The pull-up control circuit 12 is electrically connected to the first pull-up node PU, and configured to control the first pull-up node PU to be electrically connected to the input end INPUT at the input stage.

During the operation of the gate driving circuit unit in FIG. 8, at the input stage, the pull-up node control circuit 90 may control the first pull-up node PU to be electrically connected to the second pull-up node PU_1 under the control of the first control voltage provided by VDD_A or the second control voltage provided by VDD_B, so as to charge the energy storage circuit until the potential at the second pull-up node PU_1 has been pulled up to a certain value. Then, the pull-up node control circuit 90 may control the first pull-up node PU to be electrically disconnected from the second pull-up node PU_1, so as to charge the second pull-up node PU_1. In addition, during the operation of the gate driving circuit unit, within a time period between the input stage and the output stage (in the embodiments of the present disclosure, when a duty ratio of the clock signal adopted by the gate driving circuit unit is not equal to 0.5, there may exist a time period between the input stage and the output stage), the pull-up node control circuit 90 may prevent the potential at the second pull-up node PU_1 from being pulled down due to current leakage under the control of the first control voltage or the second control voltage, thereby to prevent the occurrence of such a situation where the potential at the pull-down node cannot be pulled down.

In a possible embodiment of the present disclosure, the pull-up node control circuit may include a first pull-up control transistor and a second pull-up control transistor. A control electrode of the first pull-up control transistor may be electrically connected to the first control voltage end, a first electrode of the first pull-up control transistor may be electrically connected to the second pull-up node, and a second electrode of the first pull-up control transistor may be electrically connected to the first pull-up node. A control electrode of the second pull-up control transistor may be electrically connected to the second control voltage end, a first electrode of the second pull-up control transistor may be electrically connected to the second pull-up node, and a second electrode of the second pull-up control transistor may be electrically connected to the first pull-up node.

In the embodiments of the present disclosure, the gate driving circuit unit may further include a pull-down node control circuit, a carry signal output circuit, a gate driving signal output circuit and an energy storage circuit.

The pull-down node control circuit may be electrically connected to a second pull-up node, a pull-down node and a first low voltage end, and configured to control the pull-down node to be electrically connected to the control voltage end under the control of the control voltage provide by the control voltage end, control the pull-down node to be electrically connected to, or electrically disconnected from, the first low voltage end under the control of the potential at the second pull-up node, and control the potential at the pull-down node under the control of the control voltage and the potential at the second pull-up node.

The energy storage circuit may be electrically connected to the second pull-up node, and configured to maintain the potential at the second pull-up node.

The carry signal output circuit may be electrically connected to a carry signal output end, the second pull-up node, the pull-down node, a second clock signal end and the first low voltage end, and configured to control the carry signal output end to be electrically connected to the second clock signal end under the control of the potential at the second pull-up node, control the carry signal output end to be electrically connected to the first low voltage end under the control of the potential at the pull-down node, and control the carry signal output end to output a carry signal under the control of the potential at the pull-down node and the potential at the second pull-up node.

The gate driving signal output circuit may be electrically connected to a gate driving signal output end, the second pull-up node, the pull-down node, the second clock signal end and a second low voltage end, and configured to control the gate driving signal output end to be electrically connected to the second clock signal end under the control of the potential at the second pull-up node, control the gate driving signal output end to be electrically connected to the second low voltage end under the control of the potential at the pull-down node, and control the gate driving signal output end to output a gate driving signal under the control of the potential at the pull-down node and the potential at the second pull-up node.

In a possible embodiment of the present disclosure, the pull-down node may include a first pull-down node and a second pull-down node, and the control voltage end may include a first control voltage end and a second control voltage end. The pull-down node control circuit is configured to control a potential at the first pull-down node under the control of a first control voltage provided by the first control voltage end, control the first pull-down node to be electrically connected to, or electrically disconnected from, the first low voltage end under the control of the second pull-up node, control a potential at the second pull-down node under the control of a second control voltage provided by the second control voltage end, and control the second pull-down node to be electrically connected to the first low voltage end under the control of the second pull-up node.

In a possible embodiment of the present disclosure, the pull-down node control circuit may include a first pull-down control transistor, a second pull-down control transistor, a third pull-down control transistor and a fourth pull-down control transistor. A control electrode and a first electrode of the first pull-down control transistor may be electrically connected to the first control voltage end, and a second electrode of the first pull-down control transistor may be electrically connected to the first pull-down node. A control electrode of the second pull-down control transistor may be electrically connected to the second pull-up node, a first electrode of the second pull-down control transistor may be electrically connected to the first pull-down node, and a second electrode of the second pull-down control transistor may be electrically connected to the first low voltage end. A control electrode and a first electrode of the third pull-down control transistor may be electrically connected to the second control voltage end, and a second electrode of the third pull-down control transistor may be electrically connected to the second pull-down node. A control electrode of the fourth pull-down control transistor may be electrically connected to the second pull-up node, a first electrode of the fourth pull-down control transistor may be electrically connected to the second pull-down node, and a second electrode of the fourth pull-down control transistor may be electrically connected to the first low voltage end.

During the implementation, the carry signal output circuit may include a first carry signal output transistor, a second carry signal output transistor and a third carry signal output transistor, and the gate driving signal output circuit may include a first gate driving output transistor, a second gate driving output transistor and a third gate driving output transistor.

A control electrode of the first carry signal output transistor may be electrically connected to the second pull-up node, a first electrode of the first carry signal output transistor may be electrically connected to the second clock signal end, and a second electrode of the first carry signal output transistor may be electrically connected to the carry signal output end.

A control electrode of the second carry signal output transistor may be electrically connected to the first pull-down node, a first electrode of the second carry signal output transistor may be electrically connected to the carry signal output end, and a second electrode of the second carry signal output transistor may be electrically connected to the first low voltage end.

A control electrode of the third carry signal output transistor may be electrically connected to the second pull-down node, a first electrode of the third carry signal output transistor may be electrically connected to the carry signal output end, and a second electrode of the third carry signal output transistor may be electrically connected to the first low voltage end.

A control electrode of the first gate driving output transistor may be electrically connected to the second pull-up node, a first electrode of the first gate driving output transistor may be electrically connected to the second clock signal end, and a second electrode of the first gate driving output transistor may be electrically connected to the gate driving signal output end.

A control electrode of the second gate driving output transistor may be electrically connected to the first pull-down node, a first electrode of the second gate driving output transistor may be electrically connected to the gate driving signal output end, and a second electrode of the second gate driving output transistor may be electrically connected to the second low voltage end.

A control electrode of the third gate driving output transistor may be electrically connected to the second pull-down node, a first electrode of the third gate driving output transistor may be electrically connected to the gate driving signal output end, and a second electrode of the third gate driving output transistor may be electrically connected to the second low voltage end.

Figure 9:
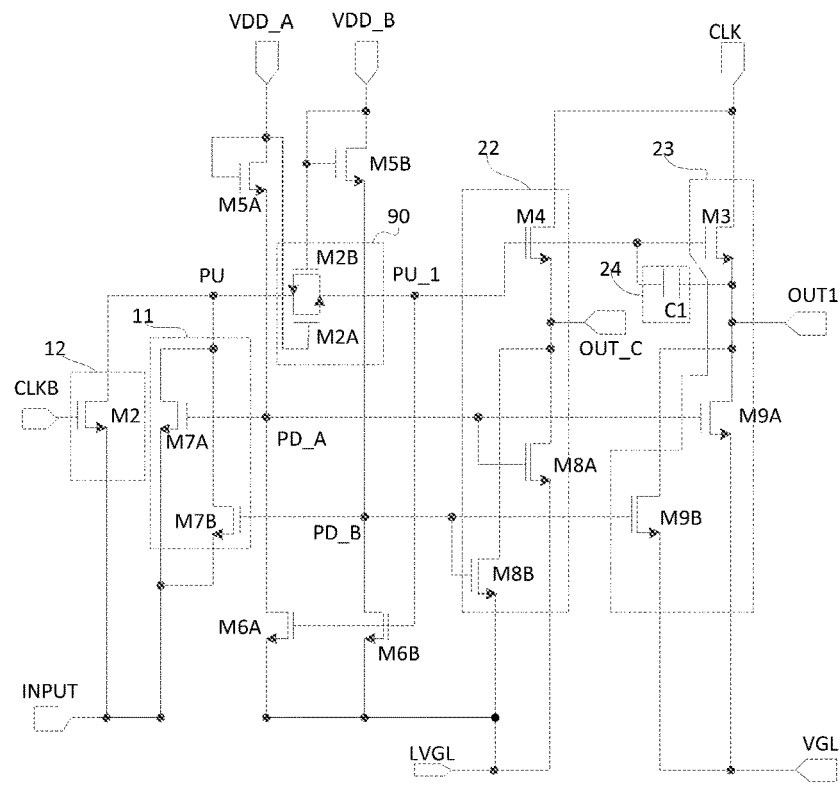
FIG. 9 is yet another circuit diagram of the gate driving circuit unit according to an embodiment of the present disclosure.

As shown in FIG. 9, the gate driving circuit unit includes a pull-up node control circuit 90, a pull-up node noise-reduction circuit 11, a pull-up control circuit 12, a pull-down node control circuit, a carry signal output circuit 22, a gate driving signal output circuit 23 and an energy storage circuit 24.

The pull-down node includes a first pull-down node PD_A and a second pull-down node PD_B, and a control voltage end includes a first control voltage end VDD_A and a second control voltage end VDD_B.

The pull-up node control circuit 90 includes a first pull-up control transistor M2A and a second pull-up control transistor M2B. A gate electrode of the first pull-up control transistor M2A is electrically connected to the first control voltage end VDD_A, a drain electrode of the first pull-up control transistor M2A is electrically connected to the second pull-up node PU_1, and a source electrode of the first pull-up control transistor M2A is electrically connected to the first pull-up node PU. A gate electrode of the second pull-up control transistor M2B is electrically connected to the second control voltage end VDD_B, a drain electrode of the second pull-up control transistor M2B is electrically connected to the second pull-up node PU_1, and a source electrode of the second pull-up control transistor M2B is electrically connected to the first pull-up node PU.

The pull-up node noise-reduction circuit 11 includes a first pull-up node noise-reduction transistor M7A and a second pull-up node noise-reduction transistor M7B. A gate electrode of the first pull-up node noise-reduction transistor M7A is electrically connected to the first pull-down node PD_A, a drain electrode of the first pull-up node noise-reduction transistor M7A is electrically connected to the second pull-up node PU_1, and a source electrode of the first pull-up node noise-reduction transistor M7A is electrically connected to the input end INPUT. A gate electrode of the second pull-up node noise-reduction transistor M7B is electrically connected to the second pull-down node PD_B, a drain electrode of the second pull-up node noise-reduction transistor M7B is electrically connected to the second pull-up node PU_1, and a source electrode of the second pull-up node noise-reduction transistor M7B is electrically connected to the input end INPUT.

The pull-up control circuit 12 includes a pull-up control transistor M2, a gate electrode of which is electrically connected to a first clock signal end, a drain electrode of which is electrically connected to the pull-up node PU, and a source electrode of which is electrically connected to the input end INPUT. The first clock signal end is configured to provide a first clock signal CLKB.

The pull-down node control circuit includes a first pull-down control transistor M5A, a second pull-down control transistor M6A, a third pull-down control transistor M5B and a fourth pull-down control transistor M6B. A gate electrode and a drain electrode of the first pull-down control transistor M5A are electrically connected to the first control voltage end VDD_A, and a source electrode of the first pull-down control transistor M5A is electrically connected to the first pull-down node PD_A. A gate electrode of the second pull-down control transistor M6A is electrically connected to the second pull-up node PU_1, a drain electrode of the second pull-down control transistor M6A is electrically connected to the first pull-down node PD_A, and a source electrode of the second pull-down control transistor M6A is electrically connected to the first low voltage end. The first low voltage end is configured to provide a first low voltage LVGL. A gate electrode and a drain electrode of the third pull-down control transistor M5B are electrically connected to the second control voltage end VDD_B, and a source electrode of the third pull-down control transistor M5B is electrically connected to the second pull-down node PD_B. A gate electrode of the fourth pull-down control transistor M6B is electrically connected to the second pull-up node PU_1, a drain electrode of the fourth pull-down control transistor M6B is electrically connected to the second pull-down node PD_B, and a source electrode of the fourth pull-down control transistor M6B is electrically connected to the first low voltage end.

The carry signal output circuit 22 includes a first carry signal output transistor M4, a second carry signal output transistor M8A and a third carry signal output transistor M8B, and the gate driving signal output circuit 23 includes a first gate driving output transistor M3, a second gate driving output transistor M9A and a third gate driving output transistor M9B.

A gate electrode of the first carry signal output transistor M4 is electrically connected to the second pull-up node PU_1, a drain electrode of the first carry signal output transistor M4 is electrically connected to the second clock signal end, and a source electrode of the first carry signal output transistor M4 is electrically connected to the carry signal output end OUT_C. The second clock signal end is configured to provide a second clock signal CLK.

A gate electrode of the second carry signal output transistor M8A is electrically connected to the first pull-down node PD_A, a drain electrode of the second carry signal output transistor M8A is electrically connected to the carry signal output end OUT_C, and a source electrode of the second carry signal output transistor M8A is electrically connected to the first low voltage end. The first low voltage end is configured to provide a first low voltage LVGL.

A gate electrode of the third carry signal output transistor M8B is electrically connected to the second pull-down node PD_B, a drain electrode of the third carry signal output transistor M8B is electrically connected to the carry signal output end OUT_C, and a source electrode of the third carry signal output transistor M8B is electrically connected to the first low voltage end.

A gate electrode of the first gate driving output transistor M3 is electrically connected to the second pull-up node PU_1, a drain electrode of the first gate driving output transistor M3 is electrically connected to the second clock signal end, and a source electrode of the first gate driving output transistor M3 is electrically connected to the gate driving signal output end OUT1.

A gate electrode of the second gate driving output transistor M9A is electrically connected to the first pull-down node PD_A, a drain electrode of the second gate driving output transistor M9A is electrically connected to the gate driving signal output end OUT1, and a source electrode of the second gate driving output transistor M9A is electrically connected to the second low voltage end. The second low voltage end is configured to provide a second low voltage VGL.

A gate electrode of the third gate driving output transistor M9B is electrically connected to the second pull-down node PD_B, a drain electrode of the third gate driving output transistor M9B is electrically connected to the gate driving signal output end OUT1, and a source electrode of the third gate driving output transistor M9B is electrically connected to the second low voltage end.

The energy storage circuit 24 includes a storage capacitor C1, a first end of which is electrically connected to the second pull-up node PU_1, and a second end of which is electrically connected to the gate driving signal output end OUT1.

In the gate driving circuit unit in FIG. 9, all the transistors may be, but not limited to, NMOS transistors.

Figure 10:
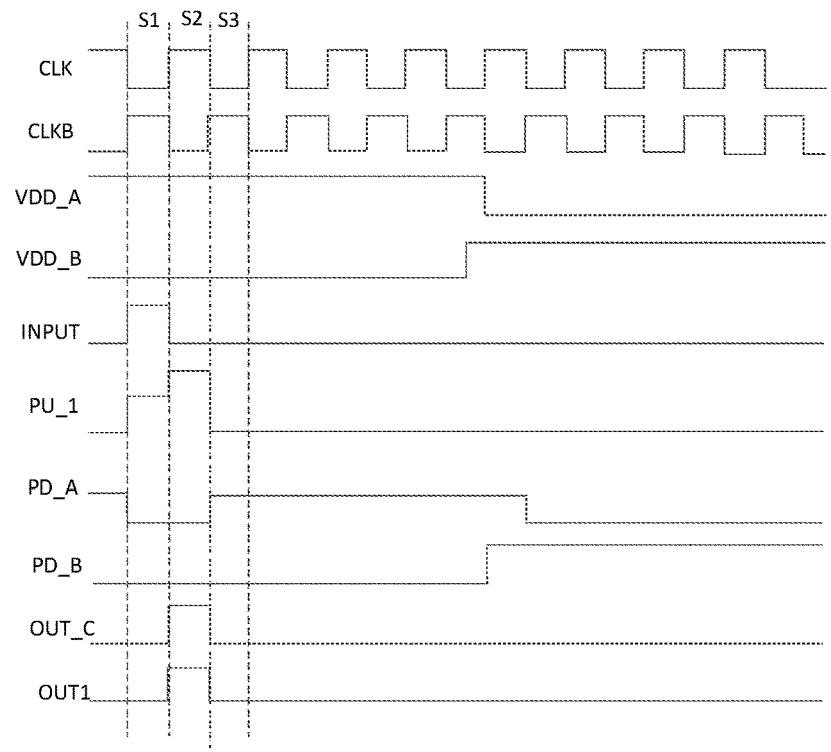
FIG. 10 is a sequence diagram of the gate driving circuit unit in FIG. 9.

As shown in FIG. 10, during the operation of the gate driving circuit unit in FIG. 9, at the input stage S1, CLK may be a low voltage, CLKB may be a high voltage, VDD_A may provide a high voltage, VDD_B may provide a low voltage, and INPUT may provide a high voltage, so as to turn on M2 and enable the potential at PU to be a high voltage. M5A may be turned on, and M2A may be turned on at the beginning of S1, so as to enable PU to be electrically connected to PU_1, thereby to charge C1 and pull up the potential at PU_1. When the potential at PU_1 reaches a predetermined value, M2A may be turned off. M6A and M6B may be turned on, the potential at PD_A and the potential at PD_B may each be a low voltage, and OUT1 and OUT_C may each output a low voltage. In addition, the source electrode of M7A and the source electrode of M7B are electrically connected to INPUT, even when the potential at PD_A and the potential at PD_B are not pulled down rapidly at the input stage S1, M7A and M7B may be turned on, and PU may be electrically connected to INPUT, so as to charge PU and prevent the occurrence of a competition risk between the PD and the PU at the input stage as compared with the related art.

At the output stage S2, CLK may be a high voltage, CLKB may be a low voltage, VDD_A may provide a high voltage, VDD_B may provide a low voltage, and INPUT may provide a low voltage, so as to turn off M2, and turn on M4 and M3, OUT1 and OUT_C may each output a high voltage, and the potential at PU_1 may be bootstrapped by C1, so as to turn on M6A and M6B, thereby to pull down the potential at PD_A and the potential at PD_B.

At the output stage S2, a potential at the gate electrode of M2A may be the high voltage provided by VDD_A, a potential at the source electrode of M2A may be the potential at PU, and a potential at the drain electrode of M2A may be the potential at PU_1 (the potential at PU_1 is higher than that at PU), so M2A may be turned off, so as to further maintain the potential at PU_1 and fully turn on M6A and M6B. The potential at PD_A and the potential at PD_B may each be a low voltage, so as to turn off M7A, M7B, M8A, M8B, M9A and M9B.

At the resetting stage S3, CLK may be a low voltage, CLKB may be a high voltage, VDD_A may provide a high voltage, VDD_B may provide a low voltage, and INPUT may provide a low voltage, so as to turn on M2 and pull down the potential at PU to a low voltage. M2A may be turned on, so as to pull down the potential at PU_1 to a low voltage. M5A may be turned on, M6A and M6B may be turned off, and M5B may be turned off. The potential at PD_A may be a high voltage, the potential at PD_B may be a low voltage, so as to turn on M8A and M9A, turn off M8B and M9B, and turn off M3 and M4. OUT_C may output LVGL, and OUT1 may output VGL.

Before the arrival of a next-frame signal or after a time for displaying several image frames, the first control voltage provided by VDD_A and the second control voltage provided by VDD_B may be switched between a high voltage and a low voltage, so as to maintain a normal noise-reduction function. In addition, it is able to prevent the gate driving circuit unit from failing due to a biased threshold voltage when the noise-reduction transistors controlled by PD_A and the noise-reduction transistors controlled by PD_B are subjected to a forward stress for a long period of time.

During the operation of the gate driving circuit unit in FIG. 9, when a duty ratio of CLK and a duty ratio of CLKB are not equal to 0.5, there may exist a time period between the input stage and the output stage, and within this time period, the potential at PU_1 may not be pulled down to a too small value due to the existence of M2A and M2B.

The present disclosure further provides in some embodiments a gate driving circuit including a plurality of levels of the above-mentioned gate driving circuit units.

During the implementation, each gate driving circuit unit may include an input end and a carry signal output end. An input end of a current-level gate driving circuit unit may be electrically connected to a carry signal output end of a previous-level gate driving circuit unit.

Figure 11:
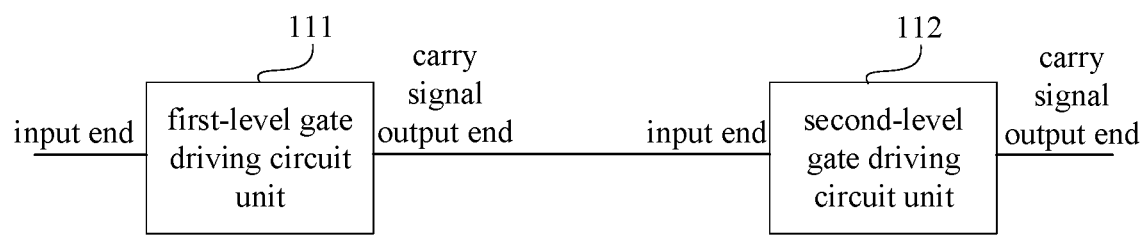
FIG. 11 is a schematic view showing a gate driving circuit according to an embodiment of the present disclosure.

For example, as shown in FIG. 11, the gate driving circuit includes a first-level gate driving circuit unit 111 and a second-level gate driving circuit unit 112, and an input end of the second-level gate driving circuit 112 is electrically connected to a carry signal output end of the previous first-level gate driving circuit unit 111.

The present disclosure further provides in some embodiments a display device including the above-mentioned gate driving circuit.

The display device may be any product or member having a display function, e.g., mobile phone, tablet computer, television, display, laptop computer, digital photo frame or navigator.

The above embodiments are for illustrative purposes only, but the present disclosure is not limited thereto. It should be appreciated that a person skilled in the art may make further modifications and improvements without departing from the spirit of the present disclosure, and these modifications and improvements shall also fall within the scope of the present disclosure.

What is claimed is:

1. A gate driving circuit unit, comprising a pull-up node noise-reduction circuit and a pull-up control circuit,
   the pull-up node noise-reduction circuit is electrically connected to an input end, a pull-down node and a pull-up node, and configured to control the pull-up node to be electrically connected to, or electrically disconnected from, the input end under control of a potential at the pull-down node; and
   the pull-up control circuit is electrically connected to the pull-up node and the input end, and configured to control the pull-up node to be electrically connected to the input end at an input stage of the gate driving circuit unit,
   wherein the pull-up node noise-reduction circuit is electrically connected to one pull-down node, and the pull-up node noise-reduction circuit comprises a pull-up node noise-reduction transistor, a control electrode of the pull-up node noise-reduction transistor is electrically connected to the pull-down node, a first electrode of the pull-up node noise-reduction transistor is electrically connected to the pull-up node, and a second electrode of the pull-up node noise-reduction transistor is electrically connected to the input end; or the pull-down node comprises a first pull-down node and a second pull-down node, the pull-up node noise-reduction circuit comprises a first pull-up node noise-reduction transistor and a second pull-up node noise-reduction transistor, a control electrode of the first pull-up node noise-reduction transistor is electrically connected to the first pull-down node, a first electrode of the first pull-up node noise-reduction transistor is electrically connected to the pull-up node, a second electrode of the first pull-up node noise-reduction transistor is electrically connected to the input end, a control electrode of the second pull-up node noise-reduction transistor is electrically connected to the second pull-down node, a first electrode of the second pull-up node noise-reduction transistor is electrically connected to the pull-up node, and a second electrode of the second pull-up node noise-reduction transistor is electrically connected to the input end.

2. The gate driving circuit unit according to claim 1, wherein the pull-up control circuit is further configured to reset the potential at the pull-up node at a resetting stage of the gate driving circuit unit.

3. The gate driving circuit unit according to claim 2, wherein the pull-up control circuit comprises a pull-up control transistor,
a control electrode of the pull-up control transistor is electrically connected to a first clock signal end, a first electrode of the pull-up control transistor is electrically connected to the pull-up node, and a second electrode of the pull-up control transistor is electrically connected to the input end.

4. The gate driving circuit unit according to claim 2, wherein the pull-up control circuit comprises an input transistor and a resetting transistor;
a control electrode of the input transistor and a first electrode of the input transistor are electrically connected to the input end, and a second electrode of the input transistor is electrically connected to the pull-up node; and
a control electrode of the resetting transistor is electrically connected to a resetting end, a first electrode of the resetting transistor is electrically connected to the pull-up node, and a second electrode of the resetting transistor is electrically connected to a first low voltage end or the input end.

5. The gate driving circuit unit according to claim 1, further comprising a pull-down node control circuit, a carry signal output circuit, a gate driving signal output circuit and an energy storage circuit, wherein
the pull-down node control circuit is electrically connected to a control voltage end, the pull-up node, the pull-down node and a first low voltage end, and configured to control the pull-down node to be electrically connected to the control voltage end under the control of a control voltage provided by the control voltage end, and control the pull-down node to be electrically connected to, or electrically disconnected from, the first low voltage end under the control of the potential at the pull-up node;

the energy storage circuit is electrically connected to the pull-up node, and configured to maintain the potential at the pull-up node;

the carry signal output circuit is electrically connected to a carry signal output end, the pull-up node, the pull-down node, a second clock signal end and the first low voltage end, and configured to control the carry signal output end to be electrically connected to the second clock signal end under the control of the potential at the pull-up node, and control the carry signal output end to be electrically connected to the first low voltage end under the control of the potential at the pull-down node;

the gate driving signal output circuit is electrically connected to a gate driving signal output end, the pull-up node, the pull-down node, the second clock signal end and a second low voltage end, and configured to control the gate driving signal output end to be electrically connected to the second clock signal end under the control of the potential at the pull-up node, and control the gate driving signal output end to be electrically connected to the second low voltage end under the control of the potential at the pull-down node; and a first low voltage provided by the first low voltage end is smaller than a second low voltage provided by the second low voltage end.

6. The gate driving circuit unit according to claim 5, wherein the pull-down node comprises a first pull-down node and a second pull-down node, and the control voltage end comprises a first control voltage end and a second control voltage end; and the pull-down node control circuit is configured to control a potential at the first pull-down node under the control of a first control voltage provided by the first control voltage end, control the first pull-down node to be electrically connected to, or electrically disconnected from, the first low voltage end under the control of the pull-up node, control a potential at the second pull-down node under the control of a second control voltage provided by the second control voltage end, and control the second pull-down node to be electrically connected to the first low voltage end under the control of the pull-up node.

7. The gate driving circuit unit according to claim 1, wherein the pull-up node comprises a first pull-up node and a second pull-up node, and the gate driving circuit unit further comprises a pull-up node control circuit;
the pull-up node control circuit is electrically connected to a control voltage end, the first pull-up node and the second pull-up node, and configured to control the first pull-up node to be electrically connected to, or electrically disconnected from, the second pull-up node under the control of a control voltage provided by the control voltage end, and maintain a potential at the second pull-up node;

the pull-up node noise-reduction circuit is electrically connected to the first pull-up node, and configured to control the first pull-up node to be electrically connected to the input end under the control of the potential at the pull-down; and the pull-up control circuit is electrically connected to the first pull-up node, and configured to control the first pull-up node to be electrically connected to the input end at the input stage of the gate driving circuit unit.

8. The gate driving circuit unit according to claim 7, wherein the pull-up node comprises a first pull-up node and a second pull-up node, and the gate driving circuit unit further comprises a pull-up node control circuit; and the pull-up node control circuit is electrically connected to a first control voltage end, a second control voltage end, the first pull-up node and the second pull-up node, and configured to control the first pull-up node to be electrically connected to, or electrically disconnected from, the second pull-up node under the control of a first control voltage provided by the first control voltage end, control the first pull-up node to be electrically connected to, or electrically disconnected from, the second pull-up node under the control of a second control voltage provided by the second control voltage end, and maintain a potential at the second pull-up node.

9. The gate driving circuit unit according to claim 7, further comprising a pull-down node control circuit, a carry signal output circuit, a gate driving signal output circuit and an energy storage circuit, wherein
the pull-down node control circuit is electrically connected to a control voltage end, a second pull-up node, the pull-down node and a first low voltage end, and configured to control the pull-down node to be electrically connected to the control voltage end under the control of a control voltage provide by the control voltage end, and control the pull-down node to be electrically connected to, or electrically disconnected from, the first low voltage end under the control of a potential at the second pull-up node;
the energy storage circuit is electrically connected to the second pull-up node, and configured to maintain the potential at the second pull-up node;
the carry signal output circuit is electrically connected to a carry signal output end, the second pull-up node, the pull-down node, a second clock signal end and the first low voltage end, and configured to control the carry signal output end to be electrically connected to the second clock signal end under the control of the potential at the second pull-up node, and control the carry signal output end to be electrically connected to the first low voltage end under the control of the potential at the pull-down node; and
the gate driving signal output circuit is electrically connected to a gate driving signal output end, the second pull-up node, the pull-down node, the second clock signal end and a second low voltage end, and configured to control the gate driving signal output end to be electrically connected to the second clock signal end under the control of the potential at the second pull-up node, and control the gate driving signal output end to be electrically connected to the second low voltage end under the control of the potential at the pull-down node.

10. The gate driving circuit unit according to claim 9, wherein the pull-down node comprises a first pull-down node and a second pull-down node, and the control voltage end comprises a first control voltage end and a second control voltage end; and
the pull-down node control circuit is configured to control a potential at the first pull-down node under the control of a first control voltage provided by the first control voltage end, control the first pull-down node to be electrically connected to, or electrically disconnected from, the first low voltage end under the control of the second pull-up node, control a potential at the second pull-down node under the control of a second control voltage provided by the second control voltage end, and control the second pull-down node to be electrically connected to the first low voltage end under the control of the second pull-up node.

11. A gate driving circuit, comprising a plurality of levels of the gate driving circuit units each according to claim 1.

12. The gate driving circuit according to claim 11, wherein the pull-up control circuit is further configured to reset the potential at the pull-up node at a resetting stage of the gate driving circuit unit.

13. The gate driving circuit according to claim 12, wherein the pull-up control circuit comprises a pull-up control transistor,
a control electrode of the pull-up control transistor is electrically connected to a first clock signal end, a first electrode of the pull-up control transistor is electrically connected to the pull-up node, and a second electrode of the pull-up control transistor is electrically connected to the input end.

14. The gate driving circuit according to claim 12, wherein the pull-up control circuit comprises an input transistor and a resetting transistor;
a control electrode of the input transistor and a first electrode of the input transistor are electrically connected to the input end, and a second electrode of the input transistor is electrically connected to the pull-up node; and
a control electrode of the resetting transistor is electrically connected to a resetting end, a first electrode of the resetting transistor is electrically connected to the pull-up node, and a second electrode of the resetting transistor is electrically connected to a first low voltage end or the input end.

15. The gate driving circuit according to claim 11, wherein the gate driving circuit unit further comprises a pull-down node control circuit, a carry signal output circuit, a gate driving signal output circuit and an energy storage circuit, wherein
the pull-down node control circuit is electrically connected to a control voltage end, the pull-up node, the pull-down node and a first low voltage end, and configured to control the pull-down node to be electrically connected to the control voltage end under the control of a control voltage provided by the control voltage end, and control the pull-down node to be electrically connected to, or electrically disconnected from, the first low voltage end under the control of the potential at the pull-up node;
the energy storage circuit is electrically connected to the pull-up node, and configured to maintain the potential at the pull-up node;
the carry signal output circuit is electrically connected to a carry signal output end, the pull-up node, the pull-down node, a second clock signal end and the first low voltage end, and configured to control the carry signal output end to be electrically connected to the second clock signal end under the control of the potential at the pull-up node, and control the carry signal output end to be electrically connected to the first low voltage end under the control of the potential at the pull-down node;
the gate driving signal output circuit is electrically connected to a gate driving signal output end, the pull-up node, the pull-down node, the second clock signal end and a second low voltage end, and configured to control the gate driving signal output end to be electrically connected to the second clock signal end under the control of the potential at the pull-up node, and control the gate driving signal output end to be electrically connected to the second low voltage end under the control of the potential at the pull-down node; and a first low voltage provided by the first low voltage end is smaller than a second low voltage provided by the second low voltage end.

16. The gate driving circuit according to claim 15, wherein the pull-down node comprises a first pull-down node and a second pull-down node, and the control voltage end comprises a first control voltage end and a second control voltage end; and the pull-down node control circuit is configured to control a potential at the first pull-down node under the control of a first control voltage provided by the first control voltage end, control the first pull-down node to be electrically connected to, or electrically disconnected from, the first low voltage end under the control of the pull-up node, control a potential at the second pull-down node under the control of a second control voltage provided by the second control voltage end, and control the second pull-down node to be electrically connected to the first low voltage end under the control of the pull-up node.

17. The gate driving circuit according to claim 11, wherein the pull-up node comprises a first pull-up node and a second pull-up node, and the gate driving circuit unit further comprises a pull-up node control circuit;

the pull-up node control circuit is electrically connected to a control voltage end, the first pull-up node and the second pull-up node, and configured to control the first pull-up node to be electrically connected to, or electrically disconnected from, the second pull-up node under the control of a control voltage provided by the control voltage end, and maintain a potential at the second pull-up node;

the pull-up node noise-reduction circuit is electrically connected to the first pull-up node, and configured to control the first pull-up node to be electrically connected to the input end under the control of the potential at the pull-down; and the pull-up control circuit is electrically connected to the first pull-up node, and configured to control the first pull-up node to be electrically connected to the input end at the input stage of the gate driving circuit unit.

18. A display device, comprising the gate driving circuit according to claim 11.

19. A gate driving circuit unit, comprising a pull-up node noise-reduction circuit and a pull-up control circuit, wherein the pull-up node noise-reduction circuit is electrically connected to an input end, a pull-down node and a pull-up node, and configured to control the pull-up node to be electrically connected to, or electrically disconnected from, the input end under control of a potential at the pull-down node; and the pull-up control circuit is electrically connected to the pull-up node and the input end, and configured to control the pull-up node to be electrically connected to the input end at an input stage of the gate driving circuit unit, wherein the pull-up control circuit is further configured to reset the potential at the pull-up node at a resetting stage of the gate driving circuit unit, wherein the pull-up control circuit comprises a pull-up control transistor, a control electrode of the pull-up control transistor is electrically connected to a first clock signal end, a first electrode of the pull-up control transistor is electrically connected to the pull-up node, and a second electrode of the pull-up control transistor is electrically connected to the input end.

20. A gate driving circuit unit, comprising a pull-up node noise-reduction circuit and a pull-up control circuit, wherein the pull-up node noise-reduction circuit is electrically connected to an input end, a pull-down node and a pull-up node, and configured to control the pull-up node to be electrically connected to, or electrically disconnected from, the input end under control of a potential at the pull-down node; and the pull-up control circuit is electrically connected to the pull-up node and the input end, and configured to control the pull-up node to be electrically connected to the input end at an input stage of the gate driving circuit unit, wherein the pull-up control circuit is further configured to reset the potential at the pull-up node at a resetting stage of the gate driving circuit unit, wherein the pull-up control circuit comprises an input transistor and a resetting transistor;

a control electrode of the input transistor and a first electrode of the input transistor are electrically connected to the input end, and a second electrode of the input transistor is electrically connected to the pull-up node; and a control electrode of the resetting transistor is electrically connected to a resetting end, a first electrode of the resetting transistor is electrically connected to the pull-up node, and a second electrode of the resetting transistor is electrically connected to a first low voltage end or the input end.

* * * * *